United States Patent
Mei et al.

(10) Patent No.: US 11,903,230 B2
(45) Date of Patent: Feb. 13, 2024

(54) QUANTUM DOT LIGHT-EMITTING DEVICE, MANUFACTURING METHOD AND DISPLAY DEVICE

(71) Applicant: BOE Technology Group Co., Ltd., Beijing (CN)

(72) Inventors: Wenhai Mei, Beijing (CN); Zhenqi Zhang, Beijing (CN); Aidi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 703 days.

(21) Appl. No.: 16/982,063

(22) PCT Filed: Mar. 30, 2020

(86) PCT No.: PCT/CN2020/082134
§ 371 (c)(1),
(2) Date: Sep. 18, 2020

(87) PCT Pub. No.: WO2020/238390
PCT Pub. Date: Mar. 12, 2020

(65) Prior Publication Data
US 2022/0384758 A1    Dec. 1, 2022

(30) Foreign Application Priority Data
May 31, 2019   (CN) .................. 201910473116.X (51) Int. Cl.
*H10K 50/115*    (2023.01)
*H10K 50/16*    (2023.01)
(Continued)

(52) U.S. Cl.
CPC ............. *H10K 50/16* (2023.02); *H10K 71/00* (2023.02); *H10K 85/40* (2023.02); *H10K 85/761* (2023.02);
(Continued)

(58) Field of Classification Search
CPC ........ H10K 50/16; H10K 71/00; H10K 85/40; H10K 85/761
See application file for complete search history.

(56) References Cited

U.S. PATENT DOCUMENTS

| 2002/0179898 A1 | 12/2002 | Marks et al. |
| 2008/0057424 A1 | 3/2008 | Tong et al. |

(Continued)

FOREIGN PATENT DOCUMENTS

| CN | 1950382 A | 4/2007 |
| CN | 105070849 A | 11/2015 |

(Continued)

OTHER PUBLICATIONS

European Search Report for 20811955.2 dated Apr. 18, 2023.
(Continued)

*Primary Examiner* — Nicholas J Tobergte
(74) *Attorney, Agent, or Firm* — Ling Wu; Stephen Yang; Ling and Yang Intellectual Property (57) ABSTRACT

A quantum dot light-emitting device, a manufacturing method and a display device are provided. The quantum dot light-emitting device includes a substrate and a cathode arranged on the substrate; an electron transport layer arranged on one side of the cathode, away from the substrate, wherein the electron transport layer comprises a plurality of pixel regions; an adhesive layer arranged on one side of the electron transport layer, away from the cathode; a quantum dot film layer arranged on one side of the adhesive layer, away from the electron transport layer, wherein both the quantum dot film layer and the adhesive layer are located in the pixel regions; wherein the adhesive layer is respectively connected to the electron transport layer and the quantum dot film layer through at least one of chemical bonding and physical entanglement.

20 Claims, 2 Drawing Sheets

(51) Int. Cl.
*H10K 71/00* (2023.01)
*H10K 85/40* (2023.01)
*H10K 85/00* (2023.01)
*G03F 7/16* (2006.01)
*H10K 102/00* (2023.01)

(52) U.S. Cl.
CPC .............. *G03F 7/162* (2013.01); *G03F 7/168* (2013.01); *H10K 50/115* (2023.02); *H10K 2102/321* (2023.02)

(56) References Cited

U.S. PATENT DOCUMENTS

| | | |
|---|---|---|
| 2009/0087792 A1 | 4/2009 | Iizumi et al. |
| 2010/0308369 A1 | 12/2010 | Gleason et al. |
| 2018/0108841 A1 | 4/2018 | Boe |
| 2018/0138434 A1 | 5/2018 | Yoon et al. |
| 2019/0011439 A1 | 1/2019 | Akhavan-Tafti et al. |
| 2019/0280152 A1* | 9/2019 | Kristal .................. H10K 50/15 |

FOREIGN PATENT DOCUMENTS

| | | |
|---|---|---|
| CN | 105140370 A | 12/2015 |
| CN | 106601925 A | 4/2017 |
| CN | 108075043 A | 5/2018 |
| CN | 108807720 A | 11/2018 |
| CN | 109216566 A | 1/2019 |
| CN | 109216567 A | 1/2019 |
| CN | 109326729 A | 2/2019 |
| CN | 109390476 A | 2/2019 |
| EP | 3410511 A1 | 12/2018 |
| JP | 2005101363 A | 4/2005 |
| JP | 2009087760 A | 4/2009 |
| JP | 2015099804 A | 5/2015 |
| JP | 2019505946 A | 2/2019 |
| WO | 9217333 A1 | 10/1992 |
| WO | 2006043678 A1 | 4/2006 |
| WO | 2006046678 A1 | 5/2006 |
| WO | 2018086756 A1 | 5/2018 |

OTHER PUBLICATIONS

Office Action dated Mar. 23, 2021 for Chinese Patent Application No. 201910473116.X and English Translation.
International Search Report for PCT/CN2020/082134 dated May 27, 2020.
Notice of Reasons for Refusal dated Dec. 4, 2023 for Japanese Patent Application No. 2020-567478 and English Translation.

* cited by examiner

QUANTUM DOT LIGHT-EMITTING DEVICE, MANUFACTURING METHOD AND DISPLAY DEVICE

CROSS-REFERENCE TO RELATED APPLICATION

The present application claims the priority and benefits of the patent application with the patent application number 201910473116.X filed to the China National Intellectual Property Administration on May 31, 2019, which is incorporated herein by reference in its entirety.

TECHNICAL FIELD

The present application relates to the technical field of display, in particular to a quantum dot light-emitting device, a manufacturing method and a display device.

BACKGROUND

High-resolution products have become an important direction of display product development as the consumption level improves. Currently high-resolution AMOLED (Active Matrix Organic Light Emitting Diode) products are faced with problems of high technical difficulty, low product yield and high production cost. Generally organic layers of organic light-emitting display products are prepared by methods utilizing mask evaporation. However, the mask evaporation methods have defects of difficult alignment, low yield and inability to achieve a smaller light output area, which are not able to meet the current demand for high-resolution display. In addition, the resolution of display products obtained by applying printing methods to prepare organic layers is extremely limited. With the ongoing in-depth development of quantum dot technology, the quantum dot light-emitting devices (QLED devices) is under thorough research, and the quantum efficiency is constantly improving. QLED devices can achieve a smaller light output area, which is beneficial to acquire higher resolution of the display products.

SUMMARY

The present application is based on the inventors' discovery and understanding of the following facts and problems.

In one aspect of the present application, the present application provides a quantum dot light-emitting device. The quantum dot light-emitting device includes a substrate and a cathode arranged on the substrate; an electron transport layer arranged on one side of the cathode, away from the substrate, wherein the electron transport layer includes a plurality of pixel regions; an adhesive layer arranged on one side of the electron transport layer, away from the cathode; and a quantum dot film layer arranged on one side of the adhesive layer, away from the electron transport layer. Both the quantum dot film layer and the adhesive layer are located in the pixel regions. The adhesive layer is respectively connected to the electron transport layer and the quantum dot film layer through at least one of chemical bonding and physical entanglement. As a result, the adhesive layer in the quantum dot light-emitting device is capable of significantly increasing the adhesion force between the quantum dot film layer and the electron transport layer, and may effectively alleviate the problem of the quantum dot film layer peeling off during the preparation process, so that the quantum dot light-emitting device is provided with good display effect.

According to an embodiment of the present application, material constituting the adhesive layer includes a silane material or an avidin. The silane material includes a first functional group capable of reacting with the electron transport layer, and a second functional group capable of reacting with the quantum dot film layer. The first functional group includes at least one of a halogen atom, a hydroxyl group, an alkyl ether bond, an acetoxy group, a methoxy group, an amino group and an imino group. The second functional group includes at least one of a sulfhydryl group, an amino group, a carboxyl group and a methyl group. The avidin includes a third functional group capable of forming a chemical bond with the electron transport layer, and a fourth functional group capable of forming a chemical bond with the quantum dot film layer. Therefore, the above materials may react with the electron transport layer and the quantum dot film layer respectively, thereby significantly increasing the adhesion force between the quantum dot film layer and the electron transport layer, and effectively alleviating the peeling-off of the quantum dot film layer.

According to an embodiment of the present application, the avidin includes biotin and streptavidin connected to each other. The streptavidin includes a hydroxyl group and an amino group. The biotin includes a sulfur atom, a nitrogen atom and a carboxyl group. Therefore, the above functional groups or heteroatoms in the avidin may form chemical bonds with the electron transport layer and the quantum dot film layer respectively, thereby significantly increasing the adhesion force between the quantum dot film layer and the electron transport layer, and effectively alleviating the peeling-off of the quantum dot film layer.

According to an embodiment of the present application, the number of atoms in a main chain of the silane material is less than 7. As a result, the quantum dot light-emitting device may not be negatively affected.

According to an embodiment of the present application, the silane material includes trimethylchlorosilane, hexamethyldisilazane, tert-Butyldimethylsilyl chloride, triisopropoxysilane, dimethyldiacetoxysilane, di-tert-butyldichlorosilane or mercaptopropyltrimethoxysilane. As a result, the adhesive layer composed of the above materials may increase the adhesion force between the quantum dot film layer and the electron transport layer.

According to an embodiment of the present application, material constituting the electron transport layer includes at least one of zinc oxide, titanium oxide and nickel oxide. As a result, the above materials may result in good electron transport performances of the electron transport layer.

According to an embodiment of the present application, the quantum dot light-emitting device further includes a hole transport layer arranged on one side of the quantum dot film layer, away from the adhesive layer; a hole injection layer arranged on one side of the hole transport layer, away from the quantum dot film layer; and an anode arranged on one side of the hole injection layer, away from the hole transport layer. As a result, the service performances of the quantum dot light-emitting device may be further improved.

In another aspect of the present application, the present application provides a method for manufacturing a quantum dot light-emitting device. According to an embodiment of the present application, the method includes: forming a cathode on a substrate; forming an electron transport layer on one side of the cathode, away from the substrate, wherein the electron transport layer includes a plurality of pixel regions; and forming an adhesive layer and a quantum dot film layer, wherein the adhesive layer is arranged on one side of the electron transport layer, away from the cathode. Both the quantum dot film layer and the adhesive layer are located in the pixel regions. The adhesive layer is respectively connected to the electron transport layer and the quantum dot film layer through at least one of chemical bonding and physical entanglement. Therefore, the method has advantages of simple operation and high production yield. In addition, the adhesive layer in the resulting quantum dot light-emitting device is capable of significantly increasing the adhesion force between the quantum dot film layer and the electron transport layer, and may effectively alleviate the problem of the quantum dot film layer peeling off during the preparation process, so that the quantum dot light-emitting device is provided with good display effect.

According to an embodiment of the present application, the adhesive layer and the quantum dot film layer are formed by the following steps: forming a mask layer on one side of the electron transport layer away from the cathode and in regions other than the pixel regions; forming an adhesive material layer by soaking or spin-coating, wherein the adhesive layer covers the mask layer and the electron transport layer; spin-coating of the quantum dot material on one side of the adhesive material layer, away from the electron transport layer, and peeling off the mask layer to obtain the adhesive layer and the quantum dot film layer. As a result, the adhesive layer and the quantum dot film layer may be easily formed by such a simple method.

According to an embodiment of the present application, when forming the adhesive material layer, the time of soaking or the standing time of spin-coating is independently 5-60 min. As a result, the adhesive may fully react with the material constituting the electron transport layer, resulting an increased bonding strength between the adhesive layer and the electron transport layer.

According to an embodiment of the present application, the rotational rate of the spin-coating is 500-3000 rpm. Therefore, by setting the rotational rate of the spin-coating within the above range, the adhesive material not connected to the electron transport layer may be removed.

According to an embodiment of the present application, forming the adhesive material layer further includes an annealing treatment. The temperature of the annealing treatment is 50-300° C. The time of the annealing treatment is 5-20 min. As a result, the solvent in the adhesive layer may be removed and the molecules of the adhesive may be rearranged to a lower energy state.

According to an embodiment of the present application, the concentration of the solution for forming the adhesive layer is 10-100 mg/ml. As a result, sufficient adhesive may be ensured to react with the electron transport layer.

According to an embodiment of the present application, when forming the quantum dot film layer, the standing time of the spin-coating is 5-60 min. As a result, the quantum dot material may fully react with the adhesive material, and the bonding strength between the adhesive layer and the quantum dot film layer is enhanced, so as to provide a greater adhesion force between the quantum dot film layer and the electron transport layer.

According to an embodiment of the present application, forming the mask layer includes: spin-coating of photoresist on the whole surface of the electron transport layer, and prebaking the photoresist; exposing and developing the photoresist, removing part of the photoresist in the pixel regions, and performing annealing treatment to part of the photoresist in regions other than the pixel regions, to obtain the mask layer. As a result, it may facilitate subsequent preparation of the adhesive layer and the quantum dot film layer.

According to an embodiment of the present application, the pre-baking temperature is 60-150° C. The pre-baking time is 30-300 s. As a result, the photoresist may be pre-solidified, which is beneficial to subsequent exposure and development.

In another aspect of the present application, the present application provides a display device. According to an embodiment of the present application, the display device includes a housing and the above-mentioned quantum dot light-emitting device. The housing includes a front frame and a back panel, and the front frame and the back panel form an accommodation space. The quantum dot light-emitting device is located inside the accommodation space, and a light-emitting side of the quantum dot light-emitting device is arranged away from the back panel. Therefore, the display device has all the merits and advantages of the quantum dot light-emitting device described above, which will not be described in detail here. Generally, the display device has good display effect and higher resolution.

DESCRIPTION OF THE REFERENCE SIGNS

100: cathode; 200: electron transport layer; 300: adhesive layer; 400: quantum dot film layer; 500: hole transport layer; 600: hole injection layer; 700: anode; 800: substrate; 10: pixel regions; 20: mask layer; 21: photoresist; 30: adhesive material layer; 40: quantum dot material layer.

DETAILED DESCRIPTION

Descriptions will now be made in detail to embodiments, examples of which are illustrated in the accompanying drawings. The same or similar elements and the elements having same or similar functions are denoted by same or like reference numerals throughout the descriptions. The embodiments described herein with reference to the accompanying drawings are exemplary, and are used for explaining the present disclosure, which should not be construed to limit the present application.

Currently, there is a problem of poor display effect in the QLED devices. After in-depth research and immense experiments, the inventors find that this is mainly due to the defects in current methods for manufacturing the QLED devices. In particular, exposure and development are generally applied to realize patterning of quantum dot film layer at present. However, the quantum dot film layer may peel off during the development process, thus affecting the display effect of the QLED devices.

The present application aims at alleviating or addressing at least one of the above-mentioned problems to at least some extent.

In one aspect of the present application, the present application provides a quantum dot light-emitting device. According to an embodiment of the present application, referring to FIG. 1, the quantum dot light-emitting device includes a substrate 800, a cathode 100, an electron transport layer 200, an adhesive layer 300 and a quantum dot film layer 400. The cathode 100 is arranged on the substrate 800. The electron transport layer 200 is arranged on one side of the cathode 100, away from the substrate 800. The electron transport layer 200 includes a plurality of pixel regions 10. The adhesive layer 300 is arranged on one side of the electron transport layer 200, away from the cathode 100. The quantum dot film layer 400 is arranged on one side of the adhesive layer 300, away from the electron transport layer 200. In addition, both the quantum dot film layer 400 and the adhesive layer 300 are located in the pixel regions 10 of the electron transport layer 200. The adhesive layer 300 is respectively connected to the electron transport layer 200 and the quantum dot film layer 400 through at least one of chemical bonding and physical entanglement. That is, the quantum dot light-emitting device may be an inverted quantum dot light-emitting device. As a result, the adhesive layer in the quantum dot light-emitting device is capable of significantly increasing the adhesion force between the quantum dot film layer and the electron transport layer, and may effectively alleviate the problem of the quantum dot film layer peeling off during the preparation process, so that the quantum dot light-emitting device is provided with good display effect.

Descriptions will now be made in detail to each structure of the quantum dot light-emitting device according to particular embodiments of the present application.

Figure 1:
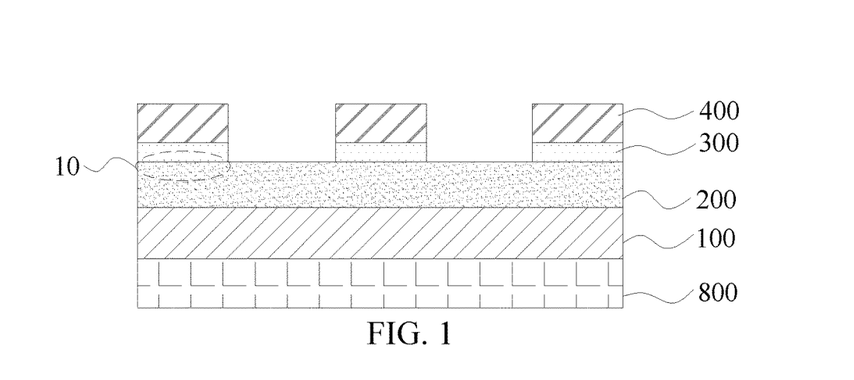
FIG. 1 shows a schematic structural diagram of a quantum dot light-emitting device according to one embodiment of the present application.

The material constituting the cathode is not particularly limited, and may be selected by those skilled in the art among the cathode materials commonly used in quantum dot light-emitting devices. For example, according to an embodiment of the present application, the cathode 100 may be composed of indium tin oxide (ITO).

The materials constituting the electron transport layer is not particularly limited, as long as it has a good electron transport function. Those skilled in the art may select the materials constituting the electron transport layer as per specific situations. For example, according to an embodiment of the present application, the electron transport layer 200 may be formed of metal oxide. In particular, the material constituting the electron transport layer 200 may include at least one of zinc oxide, nickel oxide and titanium oxide. There are certain hydroxyl groups on the surface of the above metal oxide. Hydroxyl groups are relatively active groups and may form chemical bonds with various components without affecting the electron transport effect of the metal oxides. For example, the material constituting the adhesive layer may react with hydroxyl groups on the surface of the metal oxide to realize the connection between the adhesive layer and the electron transport layer.

According to an embodiment of the present application, the adhesive layer 300 is disposed between the electron transport layer 200 and the quantum dot film layer 400. The adhesive layer 300 is respectively connected to the electron transport layer 200 and the quantum dot film layer 400 through at least one of chemical bonding and physical entanglement, to enhance adhesion force between the quantum dot film layer and the electron transport layer.

According to an embodiment of the present application, the material constituting the adhesive layer 300 may include a silane material. The Si atoms of the silane material may be connected to four functional groups. Therefore, functional groups that may chemically react or physically entangle with the electron transport layer and the quantum dot film layer at the same time may be selected. In particular, one functional group in the above silane material may chemically react with the electron transport layer, and another functional group may chemically react with the quantum dot film layer. Alternatively, one functional group in the above silane material may chemically react with the electron transport layer, and the other functional group may physically entangle with the quantum dot film layer (such as methyl, alkyl with a straight chain or branched chain).

In particular, the silane material includes a first functional group capable of reacting with the electron transport layer, and a second functional group capable of reacting with the quantum dot film layer. The first functional group includes at least one of a halogen atom, a hydroxyl group, an alkyl ether bond, an acetoxy group, a methoxy group, an amino group and an imino group. The second functional group includes at least one of a sulfhydryl group, an amino group, a carboxyl group and a methyl group. The silane material may chemically react with hydroxyl groups on the surface of metal oxides constituting the electron transport layer through functional groups such as halogen atoms, hydroxyl groups, alkyl ether bonds, acetoxy groups, methoxy groups, amino groups, imino groups and the like, so that the electron transport layer is connected to the adhesive layer through silicon-oxygen bonds. At the same time, functional groups such as sulfhydryl groups, amino groups, carboxyl groups and the like may be used to realize chemical reaction between the silane material and commonly used quantum dot material, and in particular, may be used to form coordination bonds between the silane material and quantum dot material. Alternatively, the silane material may physically entangle with the quantum dot material, to realize the connection between the adhesive layer and the quantum dot film layer.

According to an embodiment of the present application, the number of atoms in a main chain of the silane material is less than 7. As a result, the quantum dot light-emitting device may not be negatively affected. For example, the total number of silicon atoms, carbon atoms, oxygen atoms, nitrogen atoms and halogen atoms in a main chain is less than 7.

The specific composition of the silane material is not particularly limited, as long as the silane material contains the above functional groups. Those skilled in the art may select the material as per specific situations. For example, according to one particular embodiment of the present application, the silane material may be trimethylchlorosilane, hexamethyldisilazane, tert-Butyl dimethylsilyl chloride, triisopropoxysilane, dimethyldiacetoxysilane, di-tert-butyldichlorosilane or mercaptopropyltrimethoxysilane, which are not listed one by one herein.

According to an embodiment of the present application, the material constituting the adhesive layer 300 may also be avidin. The avidin contains a third functional group capable of forming a chemical bond with the electron transport layer, and a fourth functional group capable of forming a chemical bond with the quantum dot film layer. As a result, the avidin may chemically react with metal oxides constituting the electron transport layer and with quantum dot materials through the above functional groups, thus realizing the connection of the adhesive layer to the electron transport layer and quantum dot film layer. In particular, the avidin may include biotin and streptavidin connected to each other. The streptavidin contains a hydroxyl group and an amino group (i.e. the third functional group). The biotin contains a sulfur atom, a nitrogen atom and a carboxyl group (i.e. the fourth functional group). Hydroxyl groups and amino groups in streptavidin may react with hydroxyl groups on the surface of metal oxides constituting the electron transport layer. As a result, the adhesive layer and the electron transport layer are connected by silicon-oxygen bonds, and sulfur atoms, nitrogen atoms and carboxyl groups in biotin may form coordination bonds with quantum dot materials, thus realizing the connection between the adhesive layer and the quantum dot film layer.

According to an embodiment of the present application, the silane material and avidin may not only realize the connection between the adhesive layer, the electron transport layer and the quantum dot film layer, but also provide a strong adhesion force between the electron transport layer and the quantum dot film layer, thus effectively alleviating the peeling-off of the quantum dot film layer during the preparation process. And at the same time, the above materials may not cause adverse effects on the light-emitting performances of the quantum dot film layer. In addition, some of the above materials, such as the following, may also reduce the gap at the interface of electron transport layer materials, and short circuits in devices: silane materials containing halogen atoms, silane materials containing hydroxyl groups, silane materials containing alkyl ether bonds, silane materials containing acetoxy groups, and silane materials containing methoxy groups.

According to an embodiment of the present application, the quantum dot film layer 400 may include red quantum dots, green quantum dots and blue quantum dots, so as to provide the quantum dot light-emitting device with good display colors. The materials of red quantum dots, green quantum dots and blue quantum dots are not particularly limited, and may be selected by those skilled in the art among the commonly used materials in the above quantum dots.

Figure 2:
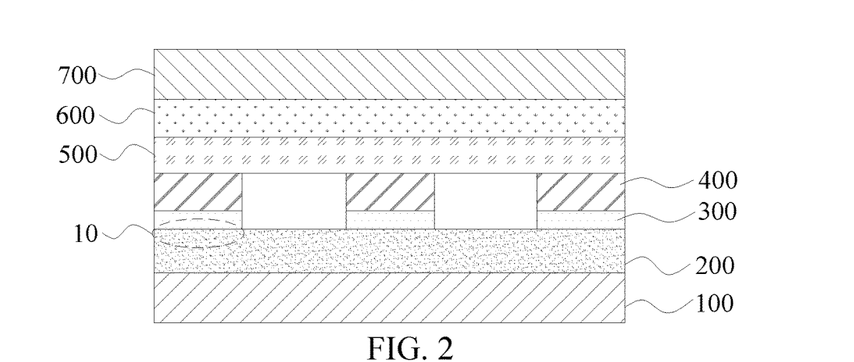
FIG. 2 shows a schematic diagram of part of structures of a quantum dot light-emitting device according to one embodiment of the present application.

According to an embodiment of the present application, referring to FIG. 2, the quantum dot light-emitting device may further includes a hole transport layer 500, a hole injection layer 600 and an anode 700. The hole transport layer 500 is arranged on one side of the quantum dot layer 400, away from the adhesive layer 300. The hole injection layer 600 is arranged on one side of the quantum dot film layer 400, away from the hole transport layer 500. The anode 700 is arranged on one side of the hole injection layer 600, away from the hole transport layer 500. As a result, the service performances of the quantum dot light-emitting device may be further improved.

The materials of the hole transport layer, the hole injection layer and the anode are not particularly limited, and may be selected by those skilled in the art among the commonly used materials in the above structures of quantum dot light-emitting devices.

In another aspect of the present application, the present application provides a method for manufacturing a quantum dot light-emitting device. According to an embodiment of the present application, the quantum dot light-emitting device manufactured by the method may be the quantum dot light-emitting device described above. Therefore, the quantum dot light-emitting device manufactured by the method may have the same merits and advantages as the quantum dot light-emitting device described above, which will not be repeated here.

Figure 3:
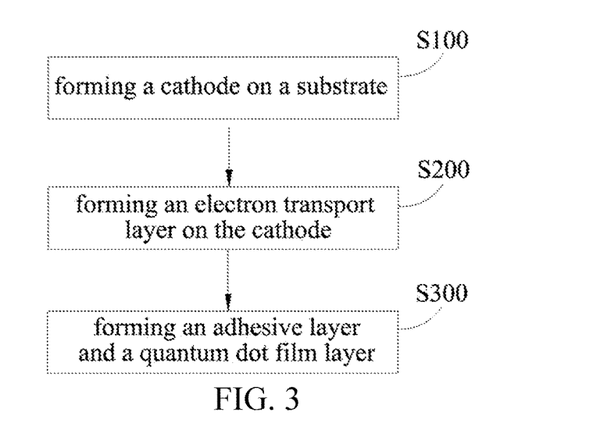
FIG. 3 shows a schematic flowchart of a method for preparing a quantum dot light-emitting device according to one embodiment of the present application.

According to an embodiment of the present application, referring to FIG. 3, the method includes: steps S100, S200, and S300.

S100: forming a cathode on a substrate

According to an embodiment of the present application, in this step, a cathode is formed on the substrate. The materials of the cathode have been described in detail before, thus will not be repeated here.

The methods for forming the cathode are not particularly limited, and may be selected by those skilled in the art according to the common methods for forming the cathode.

S200: forming an electron transport layer on the cathode

According to an embodiment of the present application, in this step, an electron transport layer is formed on the cathode. The specific materials of the electron transport layer have been described in detail before, thus will not be repeated here.

The methods for forming the electron transport layer are not particularly limited, and may be designed by those skilled in the art according to specific conditions. For example, according to an embodiment of the present application, the electron transport layer may be formed by spin-coating and annealing.

According to the embodiment of the application, the electron transport layer includes a plurality of pixel regions used for bearing the adhesive layer and the quantum dot film layer formed in the subsequent steps.

S300: forming an adhesive layer and a quantum dot film layer

According to an embodiment of the present application, in this step, an adhesive layer and a quantum dot film layer are formed. According to an embodiment of the present application, the adhesive layer is arranged on one side of the electron transport layer, away from the cathode. The quantum dot film layer is arranged on one side of the adhesive layer, away from the electron transport layer. Both the adhesive layer and the quantum dot film layer are located in the pixel regions of the electron transport layer. The adhesive layer may be respectively connected to the electron transport layer and the quantum dot film layer through at least one of chemical bonding and physical entanglement. Therefore, the adhesion force between the electron transport layer and the quantum dot film layer may be significantly enhanced, effectively alleviating the problem of the quantum dot film layer peeling off during the preparation process, so that the resulting quantum dot light-emitting device is provided good display effect.

Description has been made in detail above to the material constituting the adhesive layer, and will not be repeated here.

Figure 4:
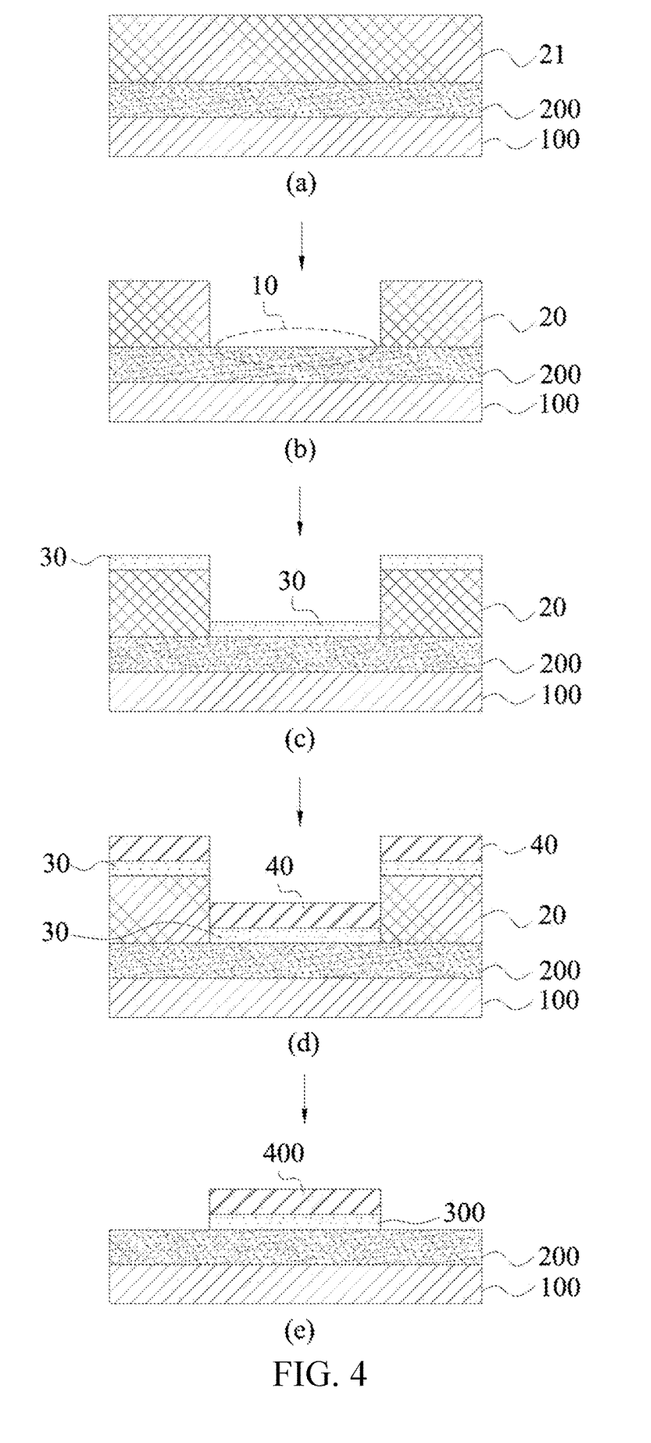
FIG. 4 shows a schematic flowchart of a method for preparing a quantum dot light-emitting device according to another embodiment of the present application.

According to an embodiment of the present application, referring to FIG. 4, the adhesive layer 300 and the quantum dot film layer 400 may be formed by the following steps: first, the mask layer 20 is formed on one side of the electron transport layer 200 away from the cathode 100 and in regions other than the pixel regions 10. In particular, the photoresist 21 is spin-coated on the whole surface of the electron transport layer 200 (referring to (a) in FIG. 4), and is prebaked. Then, the photoresist 21 is exposed and developed, part of the photoresist 21 in the pixel regions 10 is removed, and annealing treatment is performed on part of the photoresist 21 in regions other than the pixel region 10, to obtain the mask layer 20 (referring to (b) in FIG. 4). The specific species of the photoresist is not particularly limited and may be designed by those skilled in the art according to specific conditions, as long as a mask layer may be formed in the regions other than the pixel regions of the electron transport layer after exposure and development. According to an embodiment of the present application, the temperature of the prebaking may be 60-150° C., such as 85° C., 100° C.

and 120° C. The prebaking time may be 30-300 s, such as 60 s, 100 s, 150 s, 200 s and 250 s. As a result, the photoresist may be pre-solidified, which is beneficial to subsequent exposure and development. The of exposure time, the development time, the annealing temperature and the anneal time are not particularly limited, as long as the mask layer may be formed in the regions other than the pixel regions of the electron transport layer. For example, according to a particular embodiment of the present application, the exposure time may be 10 s; the development time may be 60 s; the annealing temperature may be 100° C.; and the anneal time may be 5 min.

Next, an adhesive material layer 30 is formed by soaking or spin-coating, and the adhesive material covers the mask layer 20 and the electron transport layer 200. In particular, when the adhesive material layer 30 is formed by soaking, the electron transport layer 200 provided with the mask layer 20 is soaked in the solution for forming the adhesive layer, taken out after soaking for a certain period of time, and washed with a solvent, so as to wash away the excess adhesive solution and obtain the adhesive material 30 covering the mask layer 20 and the electron transport layer 200 (referring to (c) in FIG. 4). Alternatively, when the adhesive material layer 30 is formed by spin-coating, the solution for forming the adhesive layer is applied in dropwise on the mask layer 20 and the pixel regions of the electron transport layer 200, and then, the adhesive material layer 30 covering the mask layer 20 and the electron transport layer 200 is obtained by standing for a certain time and spin drying (referring to (c) in FIG. 4).

Finally, the quantum dot material on one side of the adhesive material layer 30, away from the mask layer 20 and the electron transport layer 200 is spin-coated, and the mask layer 20 is peeled off to obtain the adhesive layer 300 and the quantum dot film layer 400. As a result, the adhesive layer and the quantum dot film layer may be easily formed by such a simple method. In particular, after spin-coating the quantum dot material, annealing treatment is performed to form quantum dot material layer 40 (referring to (d) in FIG. 4). During the process of peeling off the mask layer 20, the parts of adhesive material layer 30 and quantum dot material layer 40 respectively located on mask layer 20 may be removed synchronously, so that adhesive layer 300 and quantum dot film layer 400 may be obtained, and both adhesive layer 300 and quantum dot film layer 400 are located in electron transport layer 200 (referring to (e) in FIG. 4).

According to an embodiment of the present application, when forming the adhesive material layer, the time of soaking or the standing time of spin-coating may be independently 5-60 min, such as 20 min, 30 min, 40 min and 50 min. As a result, the adhesive material may fully react with the material constituting the electron transport layer, thus enhancing bonding strength between the adhesive layer and the electron transport layer.

According to an embodiment of the present application, when the adhesive material layer is formed by spin-coating, the rotational rate of the spin-coating may be 500-3000 rpm, such as 1000 rpm, 1500 rpm, 2000 rpm and 2500 rpm. Therefore, by setting the rotational rate of the spin-coating within the above range, the adhesive material not connected to the electron transport layer may be removed.

According to an embodiment of the present application, the solution for forming the adhesive layer may be formed by dissolving the adhesive material (such as the silane material or the avidin described above) in a solvent, thereby facilitating the reaction of the adhesive material with the metal oxide constituting the electron transport layer. The specific composition of the solvent is not particularly limited, and may be selected by those skilled in the art according to specific conditions, as long as the adhesive material may be dissolved. For example, according to a specific embodiment of the present application, the solvent may be toluene, xylene, chlorobenzene aromatic solvents, alcohol solvents (such as methanol and ethanol), polar aprotic solvents (such as N,N-dimethylformamide and N,N-dimethyl sulfoxide).

According to an embodiment of the present application, the concentration of the solution for forming the adhesive layer may be 10-100 mg/ml, such as 20 mg/ml, 30 mg/ml, 40 mg/ml, 50 mg/ml, 60 mg/ml, 70 mg/ml, 80 mg/ml, and 90 mg/ml. As a result, sufficient adhesive may be ensured to react with materials constituting the electron transport layer.

According to an embodiment of the present application, after forming the adhesive material layer by soaking or spin-coating, the adhesive material layer may also subject to an annealing treatment. The annealing temperature may be 50-300° C., such as 85° C., 100° C., 200° C. and 280° C. The anneal time may be 5-20 min, such as 10 min and 15 min. As a result, the solvent in the adhesive layer may be removed and the molecules of the adhesive may be rearranged to a lower energy state.

According to an embodiment of the present application, when forming the quantum dot film layer, the standing time after spin-coating the quantum dot material may be 5-60 min, such as 20 min, 30 min, 40 min and 50 min. As a result, the quantum dot material may fully react with the adhesive material, and the bonding strength between the adhesive layer and the quantum dot film layer is enhanced, so as to provide a greater adhesion force between the quantum dot film layer and the electron transport layer. According to an embodiment of the present application, when forming the quantum dot film layer, the annealing temperature and the anneal time of the quantum dot material are not particularly limited, and may be designed by those skilled in the art according to the temperature and time commonly used for annealing when forming the quantum dot film layer.

According to an embodiment of the present application, the quantum dot film layer may include red quantum dots, green quantum dots and blue quantum dots. After forming quantum dots of one color and an adhesive layer for connecting the quantum dots to the electron transport layer according to the above steps, the step S300 may be repeated to form quantum dots of another color and an adhesive layer for connecting the quantum dots to the electron transport layer in sequence, thereby completing the preparation of quantum dots of multiple colors.

According to an embodiment of the present application, after preparing the quantum dot film layer including quantum dots of multiple colors, the method further includes sequentially evaporating a hole transport layer, a hole injection layer and an anode on one side of the quantum dot film layer, away from the adhesive layer. As a result, the preparation of the quantum dot light-emitting device may be completed, so that the quantum dot light-emitting device may be provided with good service performances.

In view of above, the method has advantages of simple operation and high production yield, and the adhesive layer in the resulting quantum dot light-emitting device is capable of significantly increasing the adhesion force between the quantum dot film layer and the electron transport layer, and may effectively alleviate the problem of the quantum dot film layer peeling off during the preparation process, so that the quantum dot light-emitting device is provided with good display effect.

In another aspect of the present application, the present application provides a display device. According to an embodiment of the present application, the display device includes a housing and the above-mentioned quantum dot light-emitting device. The housing includes a front frame and a back panel. The front frame and the back panel form an accommodation space. In addition, the quantum dot light-emitting device is located inside the accommodation space, and a light-emitting side of the quantum dot light-emitting device is arranged away from the back panel. Therefore, the display device has all the merits and advantages of the quantum dot light-emitting device described above, which will not be repeated here. Generally, the display device has good display effect and higher resolution.

The scheme of the present application will be further illustrated by reference to specific examples below. It should be noted that the following examples are only used to illustrate the present application, and should not be regarded as limiting the scope of the present application. If particular technologies or conditions are not indicated in the examples, it shall be carried out according to the technologies or conditions described in the literature in the art or according to the product specification.

Example of a First Category

Step (1) includes forming an ITO cathode on a substrate, spin-coating a layer of zinc oxide film on the ITO cathode, and annealing at 85° C. for 20 min to form an electron transport layer.

Step (2) includes weighting 100 mg of mercaptopropyltrimethoxysilane and dissolving in 10 ml of toluene solution to obtain an adhesive solution.

Step (3) includes spin-coating photoresist on one side of the electron transport layer, away from the cathode, prebaking at 120° C. for 2 min, then exposing and developing the photoresist, and performing an annealing treatment to form a mask layer in the regions other than the pixel regions of the electron transport layer. The exposure time is 10 s; the development time is 2 min; and the annealing temperature and the anneal time are 100° C. and 5 min respectively.

Step (4) includes soaking the electron transport layer provided with the mask layer in an adhesive solution, taking out after soaking for 30 min, washing with toluene, and then performing annealing treatment to obtain the adhesive material layer covering the mask layer and the electron transport layer. The annealing temperature and the anneal time are 85° C. and 5 min respectively.

Step (5) includes spin-coating red quantum dot material CdSe/ZnS on one side of the adhesive material layer, away from the electron transport layer and the mask layer, standing for 30 min, annealing to form a red quantum dot material layer, then peeling off the mask layer, and synchronously removing parts of the red quantum dot material layer and the adhesive material layer on the mask layer along with the peeling off of the mask layer, to obtain the adhesive layer and red quantum dots. The annealing temperature and the anneal time are 100° C. and 5 min respectively.

Step (6) includes repeating steps (3)-(5) to obtain green quantum dots, an adhesive layer for connecting the green quantum dots to the electron transport layer, blue quantum dots and an adhesive layer for connecting the blue quantum dots to the electron transport layer.

Example of a Second Category

The second example is the same in steps as the first example, except that no adhesive layer is formed between the electron transport layer and the quantum dot film layer.

The quantum dot film layers obtained from the two categories of examples described above are observed by fluorescence microscope. In particular, the parameters used by fluorescence microscope are: mercury lamp power 100 W, and wavelength 365 nm. Lenses of 5×, 10× and 20× are selected for the observation. It is found that the quantum dot film layer in the second category of examples peels off severely, with the peeling-off rate of 20%-90%, resulting an incomplete film layer. The quantum dot film layer in the first category of examples has no phenomenon of peeling-off.

Therefore, there is a strong adhesion force between the quantum dot film layer and the electron transport layer in the quantum dot light-emitting device according to an embodiment of the present application. The quantum dot film layer does not peel off significantly during the preparation process, and has a good appearance, so that the quantum dot light-emitting device is provided good display effect.

In the description of the present application, an orientation or a position relationship indicated by terms "upper", "lower", etc. is based on an orientation or a location relationship shown in the drawings, and this is only for convenience of description of the present application, but does not require that there must be a specific orientation for manufacture and operation in the present application, and therefore this cannot be understood as a limitation on the present application.

Reference throughout this specification to "an embodiment," "some embodiments,", etc., means that a particular feature, structure, material, or characteristic described in connection with the embodiment is included in at least one embodiment of the present application. In this specification, the schematic representation of the above-mentioned terms is not necessarily directed to the same embodiment or example. Moreover, the specific feature, structure, material, or characteristic described may be combined in any one or more embodiments or examples in a proper way. In addition, those skilled in the art may incorporate and combine different embodiments or examples and features of different embodiments or examples described in this specification if there is no conflict. In addition, it should be noted that in this specification, the terms "first", "second", "third" and "fourth" are only used for illustrative purposes, and cannot be understood as indicating or implying relative importance or implicitly indicating the number of indicated technical features.

Although embodiments of present application have been shown and described above, it should be understood that above embodiments are just exemplary, and cannot be construed to limit the present application. For those having ordinary skills in the art, changes, modifications, alternatives and variations may be made to the embodiments without departing from scope of the present application.

What is claimed is:
1. A quantum dot light-emitting device, comprising:
a substrate and a cathode arranged on the substrate;
an electron transport layer arranged on one side of the cathode, away from the substrate, wherein the electron transport layer comprises a plurality of pixel regions;

an adhesive layer arranged on one side of the electron transport layer, away from the cathode; and a quantum dot film layer arranged on one side of the adhesive layer, away from the electron transport layer, wherein both the quantum dot film layer and the adhesive layer are located in the pixel regions; wherein the adhesive layer is respectively connected to the electron transport layer and the quantum dot film layer through at least one of chemical bonding and physical entanglement.

2. The quantum dot light-emitting device of claim 1, wherein material constituting the adhesive layer comprises a silane material or an avidin, wherein the silane material comprises a first functional group capable of reacting with the electron transport layer, and a second functional group capable of reacting with the quantum dot film layer, wherein the first functional group comprises at least one of an halogen atom, a hydroxyl group, an alkyl ether bond, an acetoxy group, a methoxy group, an amino group and an imino group, and the second functional group comprises at least one of a sulfhydryl group, an amino group, a carboxyl group and a methyl group, and the avidin comprises a third functional group capable of forming a chemical bond with the electron transport layer, and a fourth functional group capable of forming a chemical bond with the quantum dot film layer.

3. The quantum dot light-emitting device of claim 2, wherein the avidin comprises biotin and streptavidin connected to each other, and wherein the streptavidin comprises an hydroxyl group and an amino group, and the biotin comprises a sulfur atom, a nitrogen atom and a carboxyl group.

4. The quantum dot light-emitting device of claim 2, wherein the number of atoms in a main chain of the silane material is less than 7.

5. The quantum dot light-emitting device of claim 2, wherein the silane material comprises trimethylchlorosilane, hexamethyldisilazane, tert-Butyldimethylsilyl chloride, tri-isopropoxysilane, dimethyldiacetoxysilane, di-tert-butyldichlorosilane or mercaptopropyltrimethoxysilane.

6. The quantum dot light-emitting device of claim 1, wherein material constituting the electron transport layer comprises at least one of zinc oxide, titanium oxide and nickel oxide.

7. The quantum dot light-emitting device of claim 1, further comprising:

a hole transport layer arranged on one side of the quantum dot film layer, away from the adhesive layer;

a hole injection layer arranged on one side of the hole transport layer, away from the quantum dot film layer; and an anode arranged on one side of the hole injection layer, away from the hole transport layer.

8. A method for manufacturing a quantum dot light-emitting device, comprising:

forming a cathode on a substrate;

forming an electron transport layer on one side of the cathode, away from the substrate, wherein the electron transport layer comprises a plurality of pixel regions; and forming an adhesive layer and a quantum dot film layer, wherein the adhesive layer is arranged on one side of the electron transport layer, away from the cathode, and the quantum dot film layer is arranged on one side of the adhesive layer, away from the electron transport layer; wherein the adhesive layer is respectively connected to the electron transport layer and the quantum dot film layer through at least one of chemical bonding and physical entanglement.

9. The method of claim 8, wherein the adhesive layer and the quantum dot film layer are formed by the following steps:

forming a mask layer on one side of the electron transport layer away from the cathode and in regions other than the pixel regions;

forming an adhesive material layer by soaking or spin-coating, wherein the adhesive layer covers the mask layer and the electron transport layer; and spin-coating quantum dot material on one side of the adhesive material layer, away from the electron transport layer, and peeling off the mask layer to obtain the adhesive layer and the quantum dot film layer.

10. The method of claim 9, wherein when forming the adhesive material layer, time of the soaking or standing time of the spin-coating is independently 5-60 min.

11. The method of claim 10, wherein rotational rate of the spin-coating is 500-3000 rpm.

12. The method of claim 9, wherein forming the adhesive material layer further comprises:

an annealing treatment, wherein temperature of the annealing treatment is 50-300° C. and time of the annealing treatment is 5-20 min.

13. The method of claim 9, wherein concentration of solution for forming the adhesive layer is 10-100 mg/ml.

14. The method of claim 9, wherein when forming the quantum dot film layer, standing time of the spin-coating is 5-60 min.

15. The method of claim 9, wherein forming the mask layer comprises:

spin-coating photoresist on the whole surface of the electron transport layer, and prebaking the photoresist; and exposing and developing the photoresist, removing part of the photoresist in the pixel regions, and performing annealing treatment to part of the photoresist in regions other than the pixel regions, to obtain the mask layer.

16. The method of claim 15, wherein temperature of the prebaking is 60-150° C., and time of the prebaking is 30-300 s.

17. A display device, comprising a housing and the quantum dot light-emitting device of claim 1, wherein the housing comprises a front frame and a back panel, and the front frame and the back panel form an accommodation space, and wherein the quantum dot light-emitting device is located inside the accommodation space, and a light-emitting side of the quantum dot light-emitting device is arranged away from the back panel.

18. The quantum dot light-emitting device of claim 4, wherein the silane material comprises trimethylchlorosilane, hexamethyldisilazane, tert-Butyldimethylsilyl chloride, tri-isopropoxysilane, dimethyldiacetoxysilane, di-tert-butyldichlorosilane or mercaptopropyltrimethoxysilane.

19. The quantum dot light-emitting device of claim 2, wherein material constituting the electron transport layer comprises at least one of zinc oxide, titanium oxide and nickel oxide.

20. The quantum dot light-emitting device of claim 2, further comprising:

a hole transport layer arranged on one side of the quantum dot film layer, away from the adhesive layer;

a hole injection layer arranged on one side of the hole transport layer, away from the quantum dot film layer; and an anode arranged on one side of the hole injection layer, away from the hole transport layer.

* * * * *